United States Patent
Alabin et al.

(10) Patent No.: US 7,498,665 B2
(45) Date of Patent: Mar. 3, 2009

(54) INTEGRATED CIRCUIT LEADLESS PACKAGE SYSTEM

(75) Inventors: Leocadio M. Alabin, Singapore (SG); Il Kwon Shim, Singapore (SG); Henry D. Bathan, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 239 days.

(21) Appl. No.: 11/381,726

(22) Filed: May 4, 2006

(65) Prior Publication Data

US 2007/0108567 A1 May 17, 2007

Related U.S. Application Data

(66) Substitute for application No. 60/594,779, filed on May 5, 2005.

(51) Int. Cl.
*H01L 23/495* (2006.01)
*H01L 21/44* (2006.01)

(52) U.S. Cl. ............... 257/670; 257/666; 257/E23.031; 438/123

(58) Field of Classification Search ............... 257/666, 257/670, E23.031; 438/123
See application file for complete search history.

(56) References Cited

U.S. PATENT DOCUMENTS

| 5,949,132 | A | | 9/1999 | Libres et al. |
| 6,008,528 | A | * | 12/1999 | Go et al. ..................... 257/670 |
| 6,150,709 | A | * | 11/2000 | Shin et al. ................... 257/666 |
| 6,225,685 | B1 | | 5/2001 | Newman et al. |
| 6,229,200 | B1 | * | 5/2001 | Mclellan et al. ............. 257/666 |
| 6,400,004 | B1 | * | 6/2002 | Fan et al. .................... 257/666 |
| 6,812,552 | B2 | | 11/2004 | Islam et al. |
| 6,815,806 | B1 | | 11/2004 | Awad et al. |
| 6,965,157 | B1 | | 11/2005 | Perez et al. |
| 2003/0189222 | A1 | * | 10/2003 | Itou et al. ................... 257/200 |
| 2005/0258521 | A1 | * | 11/2005 | Park et al. ................... 257/670 |

* cited by examiner

*Primary Examiner*—Nitin Parekh
(74) *Attorney, Agent, or Firm*—Mikio Ishimaru

(57) ABSTRACT

An integrated circuit leadless package system is presented comprising forming a QFN leadframe comprises providing a die pad, forming a fishtail tie-bar on the die pad, forming a row of an outer contact pad around the die pad, forming an additional outer contact pad around the fishtail tie-bar, and forming an inner contact pad in a staggered position from the outer contact pad, mounting an integrated circuit on the die pad of the QFN leadframe, and attaching a bond wire from the integrated circuit to the additional outer contact pad.

20 Claims, 5 Drawing Sheets

INTEGRATED CIRCUIT LEADLESS PACKAGE SYSTEM

CROSS-REFERENCE TO RELATED APPLICATION(S)

This application claims the benefit of U.S. Provisional Patent Application Ser. No. 60/594,779 filed May 5, 2005, and the subject matter thereof is hereby incorporated herein by reference thereto.

TECHNICAL FIELD

The present invention relates generally to integrated circuit packaging, and more particularly to a system for a dual row quad flat-pack no lead integrated circuit packaging system.

BACKGROUND ART

Mobile technology is taking over the consumer product fast lane and packaging requirements are becoming more complex and demanding. To meet this demand, the package requires better electrical and thermal performance with higher numbers of input/output terminals. With shrinking electronic devices, such as cell phones, global positioning systems, and hand held computers the integrated circuit packaging must evolve to meet the application requirements. In order to maximize the number of input/output terminal pads, certain requirement on lead spacing and tie-bar location and design have limited the ability to increase the number of terminal pads.

Leadframe types of semiconductor packages are well known and widely used in the electronics industry to house, mount, and interconnect a variety of ICs. A conventional leadframe is typically die-stamped from a sheet of flat-stock metal, and includes a plurality of metal leads temporarily held together in a planar arrangement about a central region during package manufacture by a rectangular frame comprising a plurality of expendable "dam-bars." A mounting pad for a semiconductor die is supported in the central region by "tie-bars" that attach to the frame. The leads extend from a first end integral with the frame to an opposite second end adjacent to, but spaced apart from, the die pad.

During package manufacture, an IC die is attached to the die pad. Wire-bonding pads on the die are then connected to selected ones of the inner ends of the leads by fine, conductive bond wires to convey power, ground, and signals between the die and the leads.

A protective body of an epoxy resin is molded over the assembly to enclose and seal the die, the inner ends of the leads, and the wire bonds against harmful environmental elements. The rectangular frame and the outer ends of the leads are left exposed outside of the body, and after molding, the frame is cut away from the leads and discarded, and the outer ends of the leads are appropriately formed for interconnection of the package with other, associated components.

In a variant of the above configuration, viz., a "land grid array" ("LGA"), a "quad flat no-lead" ("QFN"), or a "leadless chip carrier" ("LCC") package, the outer portions of the leads are removed entirely from the package, and a terminal pad, or "land," is provided on the lower surface of the leads and exposed through the lower surface of the body for mounting and inter-connection of the package to a PCB. In yet another variation, the die pad is "down-set" relative to the plane of the leads such that its lower surface is exposed through the lower surface of the body for enhanced dissipation of heat from the die.

The demand for higher terminal pad count has stressed this manufacturing process to its practical limit. In order to meet the demand for more input/output terminal pads, a new approach must be developed. The continued evolution of mobile devices and their convergence will continue to pressure the package designs to decrease in size while increasing the number of terminal pads.

Thus, a need still remains for an integrated circuit leadless package system. In view of the continuing pressure to increase the input/output terminal pad count and decrease package size, it is increasingly critical that answers be found to these problems. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit leadless package system comprising forming a QFN leadframe comprising providing a die pad, forming a fishtail tie-bar on the die pad, forming a row of an outer contact pad around the die pad, forming an additional instance of the outer contact pad around the fishtail tie-bar, and forming an inner contact pad in a staggered position from the outer contact pad, mounting an integrated circuit on the die pad of the QFN leadframe, and attaching a bond wire from the integrated circuit to the additional instance of the outer contact pad. Certain embodiments of the invention have other aspects in addition to or in place of those mentioned or are obvious from the above. The aspects will become apparent to those skilled in the art from a reading of the following detailed description when taken with reference to the accompanying drawings.

BEST MODE FOR CARRYING OUT THE INVENTION

Figure 1:
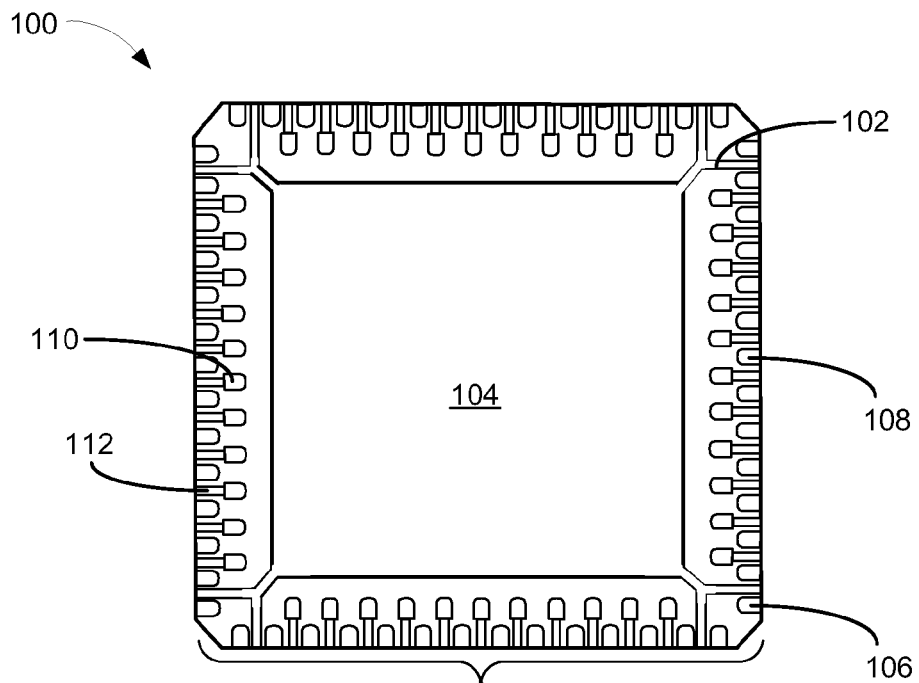
FIG. 1 is a bottom view of an integrated circuit leadless package system, with fishtail tie-bars exposed, in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

The term "horizontal" as used herein is defined as a plane extending into the drawings with a left-right orientation across the drawing. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes stamping, patterning, laser trimming, development, etching, forging, cleaning, and/or removal of the material as required in forming a described structure.

Referring now to FIG. 1, therein is shown a bottom view of an integrated circuit leadless package system 100, with fishtail tie-bars 102 exposed, in an embodiment of the present invention. The bottom view of the integrated circuit leadless package system 100 depicts the fishtail tie-bars 102 positioned near the corners of the integrated circuit leadless package system 100. The fishtail tie-bars 102 connect to and support a die pad 104, which supports an integrated circuit die (not shown). The fishtail tie-bars 102 are configured in a fishtail shape allowing additional space at the corner of the leadframe for an additional outer contact pad 106.

An outer contact pad 108 is used to fill as much of the outer diameter of the integrated circuit leadless package system 100 as possible. By using the fishtail tie-bars 102 in the fishtail configuration, one of the additional outer contact pad 106 is added per side of the package. The additional outer contact pad 106 is shorter than the fishtail shape and next to the fishtail shape without another intervening contact pad between the additional outer contact pad 106 and the fishtail tie-bar 102. The fishtail shape can also contain two outer contact pads 106 in the bifurcation of the fishtail shape. An inner contact pad 110 is aligned in a staggered row that adds to the number of input/output terminal pads of the leadframe. The inner contact pad 110 is supported by contact tie-bars 112, which is spaced between the intervals of the outer contact pad 108.

The fishtail tie-bars 102 and the contact tie-bars 112 are half etched, stamped, or forged to be of less thickness than the die pad 104, the outer contact pad 108, or the inner contact pad 110. The integrated circuit leadless package system 100 in this example is of the type quad flat-pack no-lead and represents a QFN leadframe 114.

Figure 2:
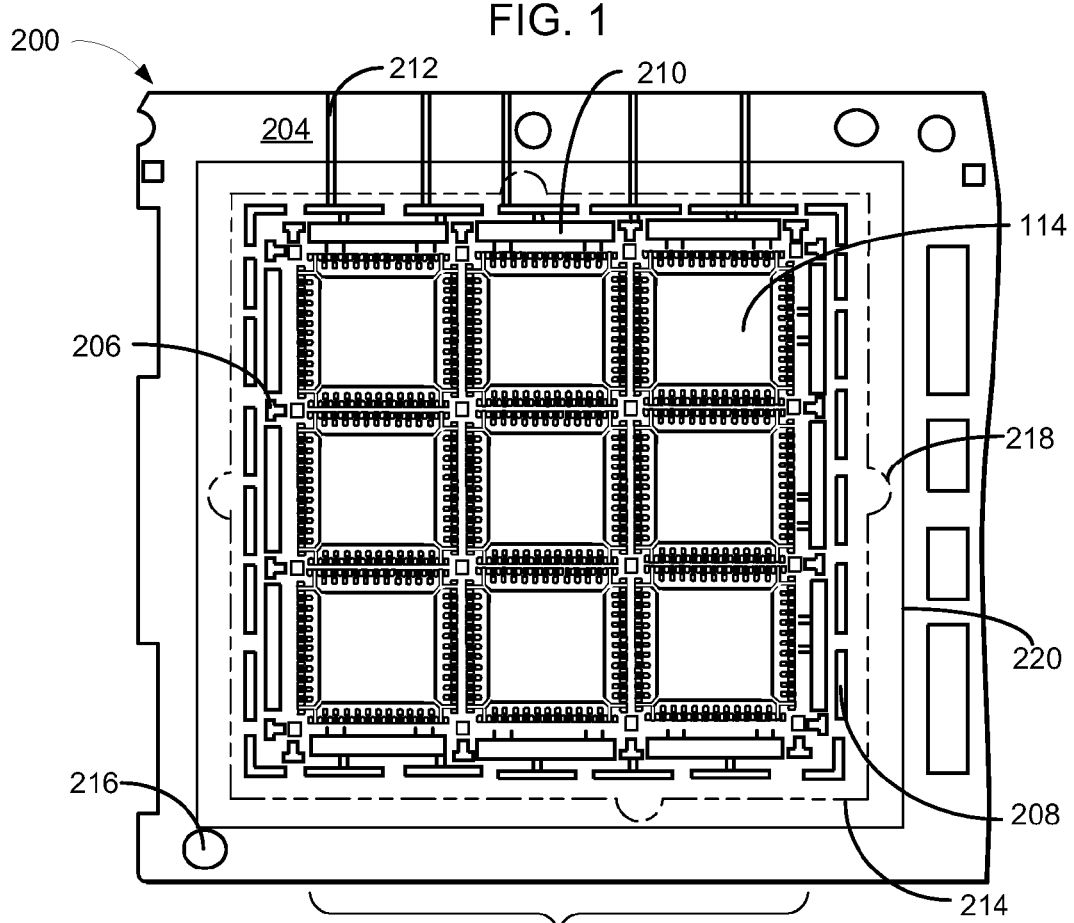
FIG. 2 is a plan view of a leadframe array, in an embodiment of the present invention.

Referring now to FIG. 2, therein is shown a plan view of a leadframe array 200, in an embodiment of the present invention. The plan view depicts a QFN leadframe array 202 of the QFN leadframe 114 patterned on a sheet material 204 in preparation for the molding process. Singulation markers 206 indicate the boundary of the individual devices in the QFN leadframe array 202. An outer reservoir 208 is positioned outside an array reservoir 210. An external air vent 212 allows the compressed air in the last row to escape to the outside environment. An encapsulation device outline 214 indicates where the encapsulation device (not shown) will contact the sheet material 204. An alignment aperture 216 is used to position the QFN leadframe array 202 correctly in the encapsulation device (not shown). The protrusion on the encapsulation device outline 214 indicates the position of an ejector pin area 218 that will allow the encapsulated device (not shown) to be released from mold cavity (not shown) after the injection process has been completed. A tape adhesive layer 220 may be applied to the QFN leadframe array 202 after the QFN leadframe array 202 has been through the half etch process, or similar process. The tape adhesive layer 220 may be optionally applied to the bottom side of the QFN leadframe array 202 in order to prevent mold bleed in a subsequent process step.

Figure 3:
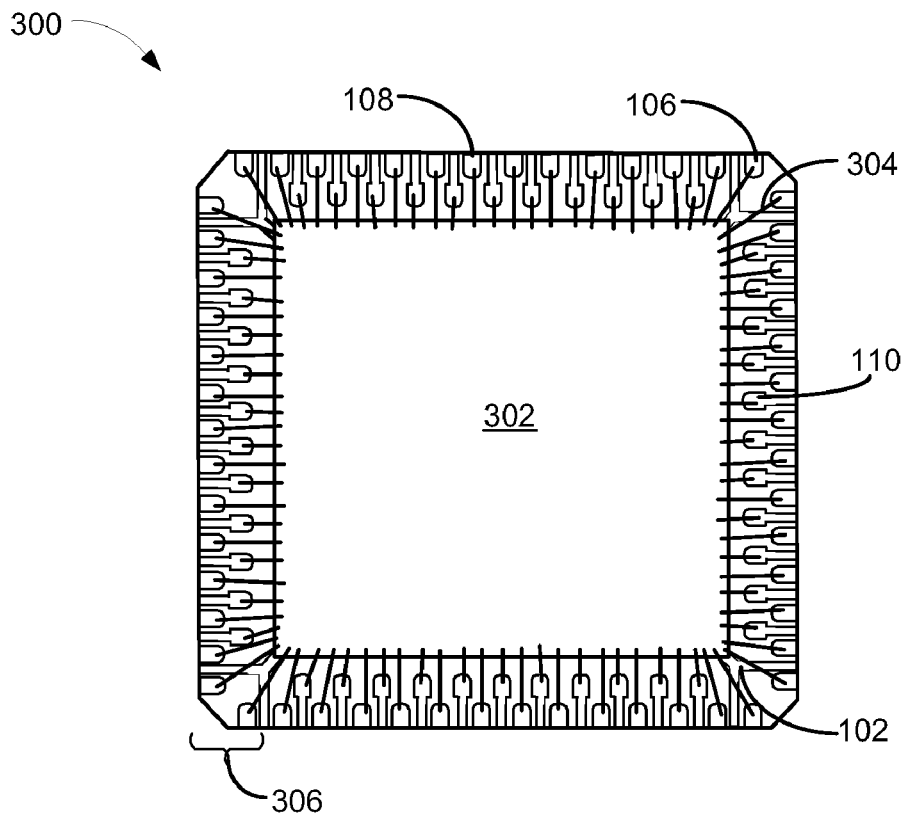
FIG. 3 is a top view of the integrated circuit leadless package system, with an integrated circuit attached, in an embodiment of the present invention.

Referring now to FIG. 3, therein is shown a top view of an integrated circuit leadless package system 300, with an integrated circuit 302 attached, in an embodiment of the present invention. The top view of the integrated circuit leadless package system 300 depicts the integrated circuit 302 mounted on the die pad (not shown). A bond wire 304 attaches the integrated circuit 302 to the additional outer contact pad 106, of FIG. 1, the outer contact pad 108, of FIG. 1, and the inner contact pad 110, of FIG. 1. The row of the outer contact pad 108 and the staggered row of the inner contact pad 110 forms a dual row of contact pads 306. The dual row of contact pads 306 and the additional outer contact pad 106 positioned around the fishtail tie-bars 102, of FIG. 1, allow the attachment of higher pin count versions of the integrated circuit 302.

Figure 4:
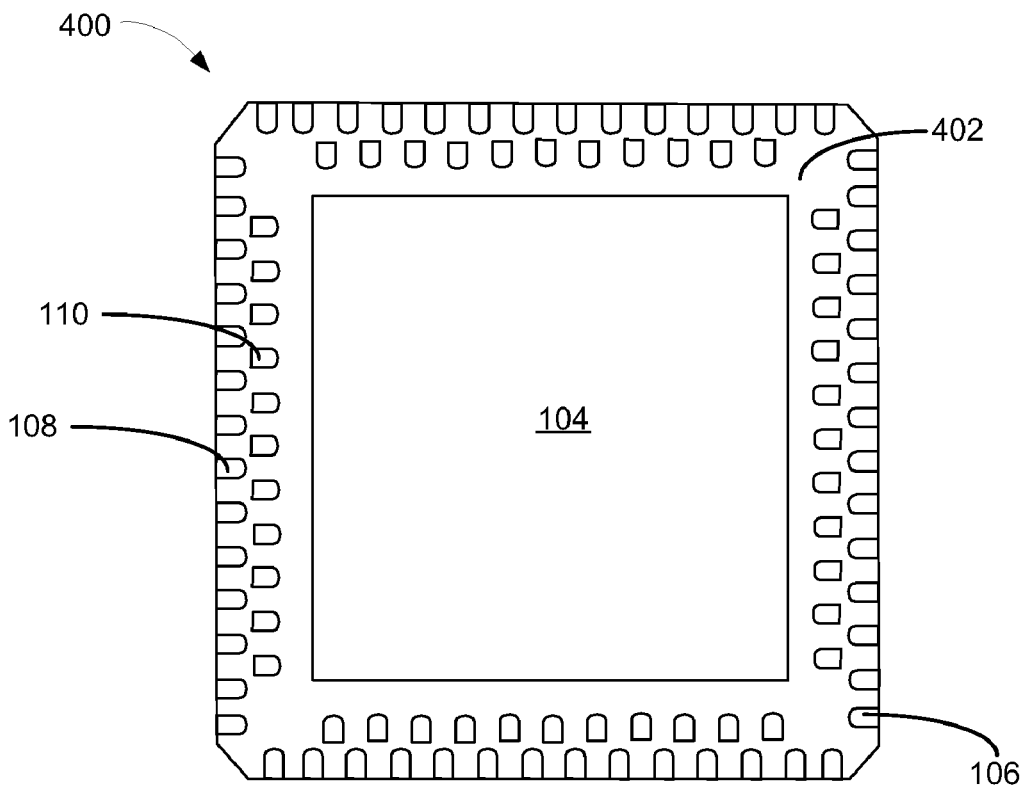
FIG. 4 is a bottom view of the finished sample of a quad flat-pack no-lead package (QFN)

Referring now to FIG. 4, therein is shown a bottom view of the finished sample of a quad flat-pack no-lead package 400 (QFN). The bottom view of the finished sample of the quad flat-pack no-lead package 400 depicts the die pad 104, of FIG. 1, which may act as a heat sink for the mounted integrated circuit (not shown), the additional outer contact pad 106, of FIG. 1, a row of the outer contact pad 108, of FIG. 1, and a row of the inner contact pad 110, of FIG. 1. A molding compound 402, such as a plastic or a ceramic, is injected around the die pad 104, the additional outer contact pad 106, the row of the outer contact pad 108 and the row of the inner contact pad 110. The surface of the molding compound 402 is co-planar with the surface of the die pad 104 and the surface of the additional outer contact pad 106, the outer contact pad 108, and the inner contact pad 110.

The molding compound 402 is an electrical insulator that may be molded around the entire package or just the leadframe, in preparation for further assembly at a later time. The fishtail tie-bars 102, of FIG. 1, and the contact tie-bars 112, of FIG. 1, are hidden beneath the molding compound 402.

Figure 5:
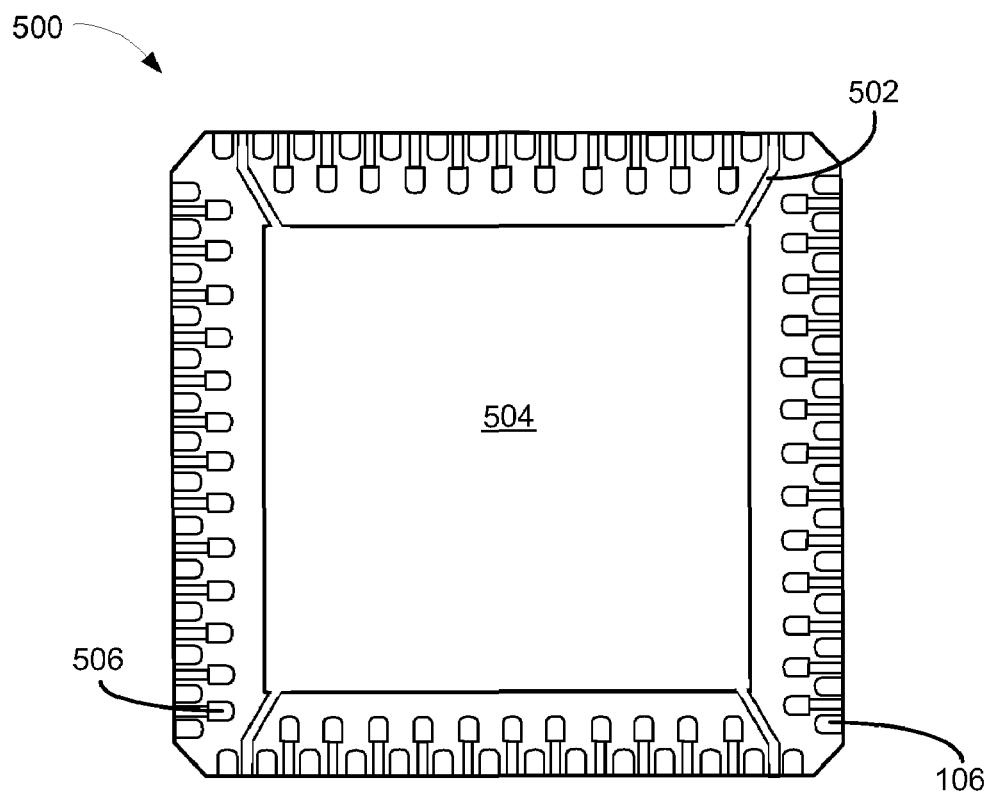
FIG. 5 is a bottom view of the integrated circuit leadless package system, with vertical tie-bars, in an alternative embodiment of the present invention.

Referring now to FIG. 5, therein is shown a bottom view of an integrated circuit leadless package system 500, with vertical tie-bars, in an alternative embodiment of the present invention. The bottom view of the integrated circuit leadless package system 500 depicts a vertical tie-bar 502 connected to a die pad 504. Using the vertical tie-bar 502 allows additional clearance on the horizontal edges of the integrated circuit leadless package system 500. The clearance may be used to instantiate an additional inner contact pad 506, and the additional outer contact pad 106, of FIG. 1. As an example, two each of the additional inner contact pad 506 has been added to each of the horizontal edges as compared to the configuration in FIG. 1. The additional input/output terminal pads are significant for this package type.

Figure 6:
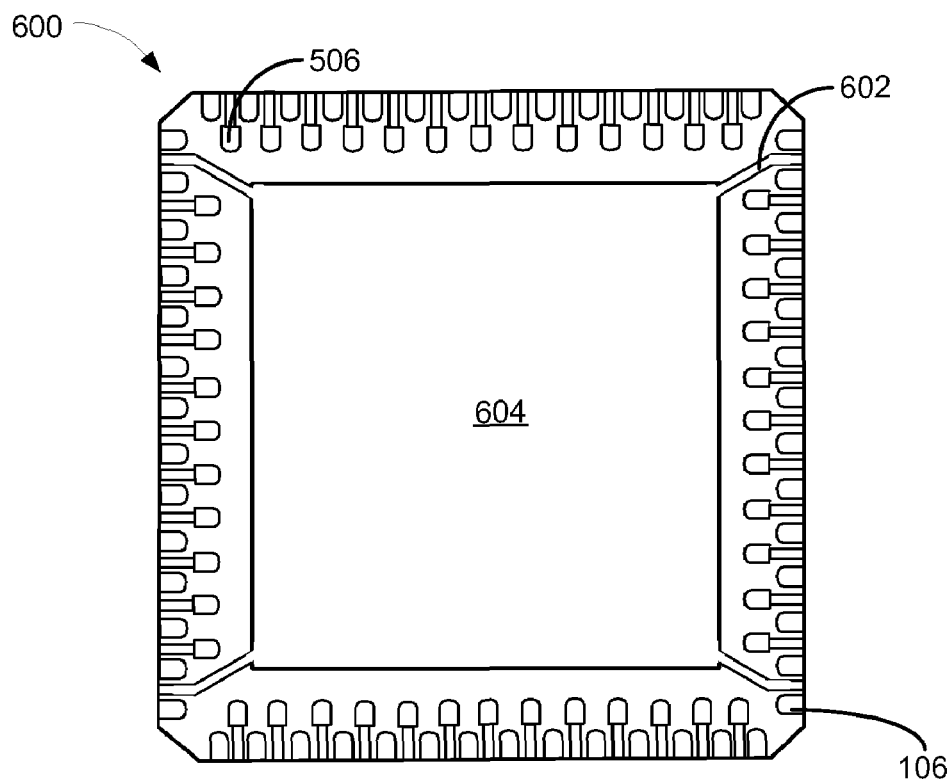
FIG. 6 is a bottom view of the integrated circuit leadless package system, with horizontal tie-bars, in another alternative embodiment of the present invention.

Referring now to FIG. 6, therein is shown a bottom view of an integrated circuit leadless package system 600, with horizontal tie-bars, in another alternative embodiment of the present invention. The bottom view of the integrated circuit leadless package system 600 depicts a horizontal tie-bar 602 connected to a die pad 604. Using the horizontal tie-bar 602 allows additional clearance on the vertical edges of the integrated circuit leadless package system 600. The clearance may be used to instantiate the additional inner contact pad 506, and the additional outer contact pad 106, of FIG. 1. As an example, two each of the additional inner contact pad 506 have been added to each of the vertical edges as compared to the configuration in FIG. 1. The additional input/output terminal pads are significant for this package type.

Figure 7:
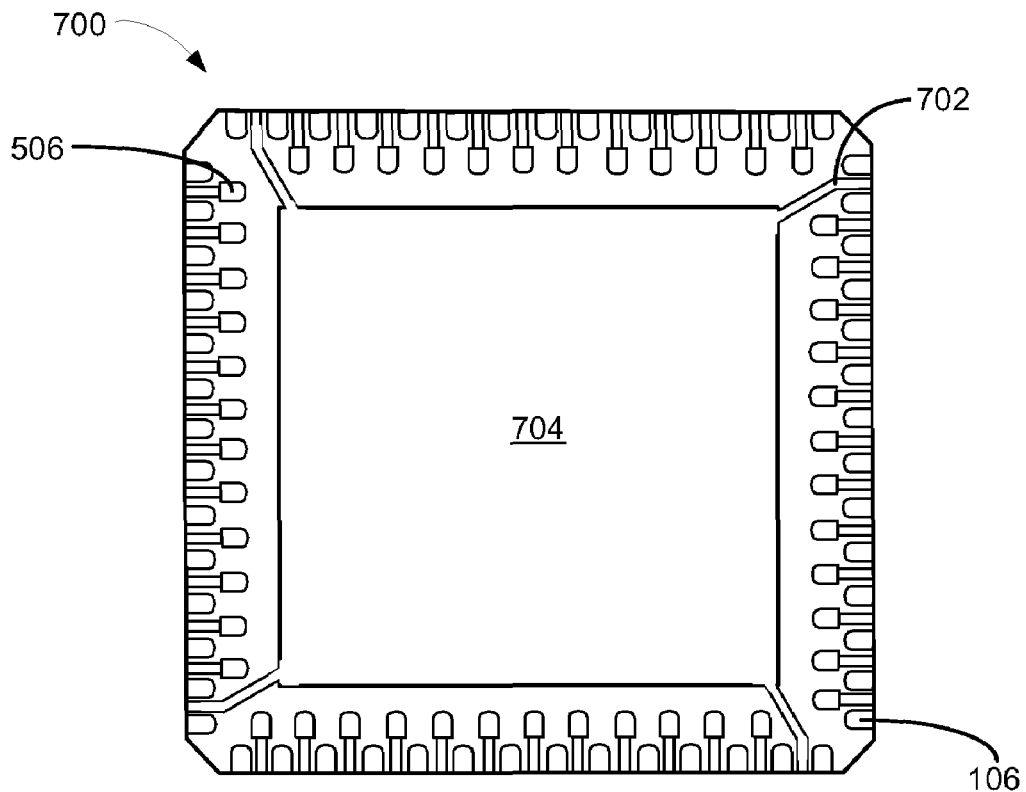
FIG. 7 is a bottom view of the integrated circuit leadless package system, with clockwise rotation tie-bars, in yet another alternative embodiment of the present invention.

Referring now to FIG. 7, therein is shown a bottom view of an integrated circuit leadless package system 700, with clockwise tie-bars, in yet another alternative embodiment of the present invention. The bottom view of the integrated circuit leadless package system 700 depicts a clockwise tie-bar 702 connected to a die pad 704. Using the clockwise tie-bar 702 allows additional clearance on each of the edges of the integrated circuit leadless package system 700. The clearance may be used to instantiate the additional inner contact pad 506, and the additional outer contact pad 106, of FIG. 1. As an example, one of the additional inner contact pad 506 has been added to each of the edges as compared to the configuration in FIG. 1. The additional input/output terminal pads are significant for this package type.

Figure 8:
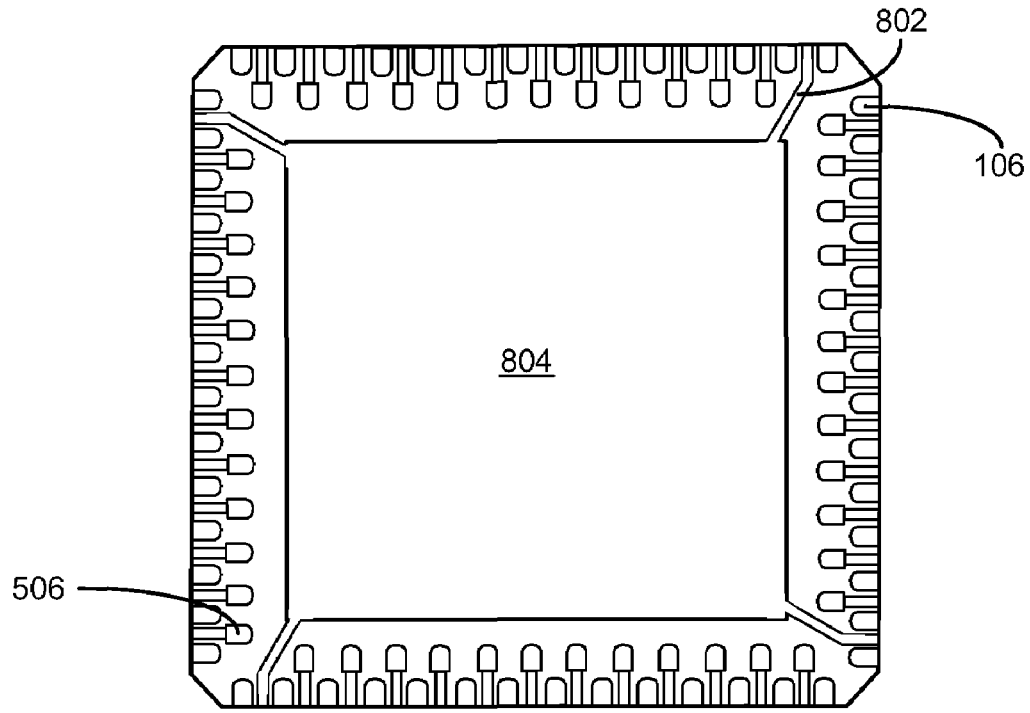
FIG. 8 is a bottom view of the integrated circuit leadless package system, with counter-clockwise rotation tie-bars, in still another alternative embodiment of the present invention.

Referring now to FIG. 8, therein is shown a bottom view of an integrated circuit leadless package system 800, with counter clockwise tie-bars, in still another alternative embodiment of the present invention. The bottom view of the integrated circuit leadless package system 800 depicts a counter clockwise tie-bar 802 connected to a die pad 804. Using the counter clockwise tie-bar 802 allows additional clearance on each of the edges of the integrated circuit leadless package system 800. The clearance may be used to instantiate the additional inner contact pad 506, and the additional outer contact pad 106, of FIG. 1. As an example, one instance of the additional inner contact pad 506 has been added to each of the edges as compared to the configuration in FIG. 1. The additional input/output terminal pads are significant for this package type.

Figure 9:
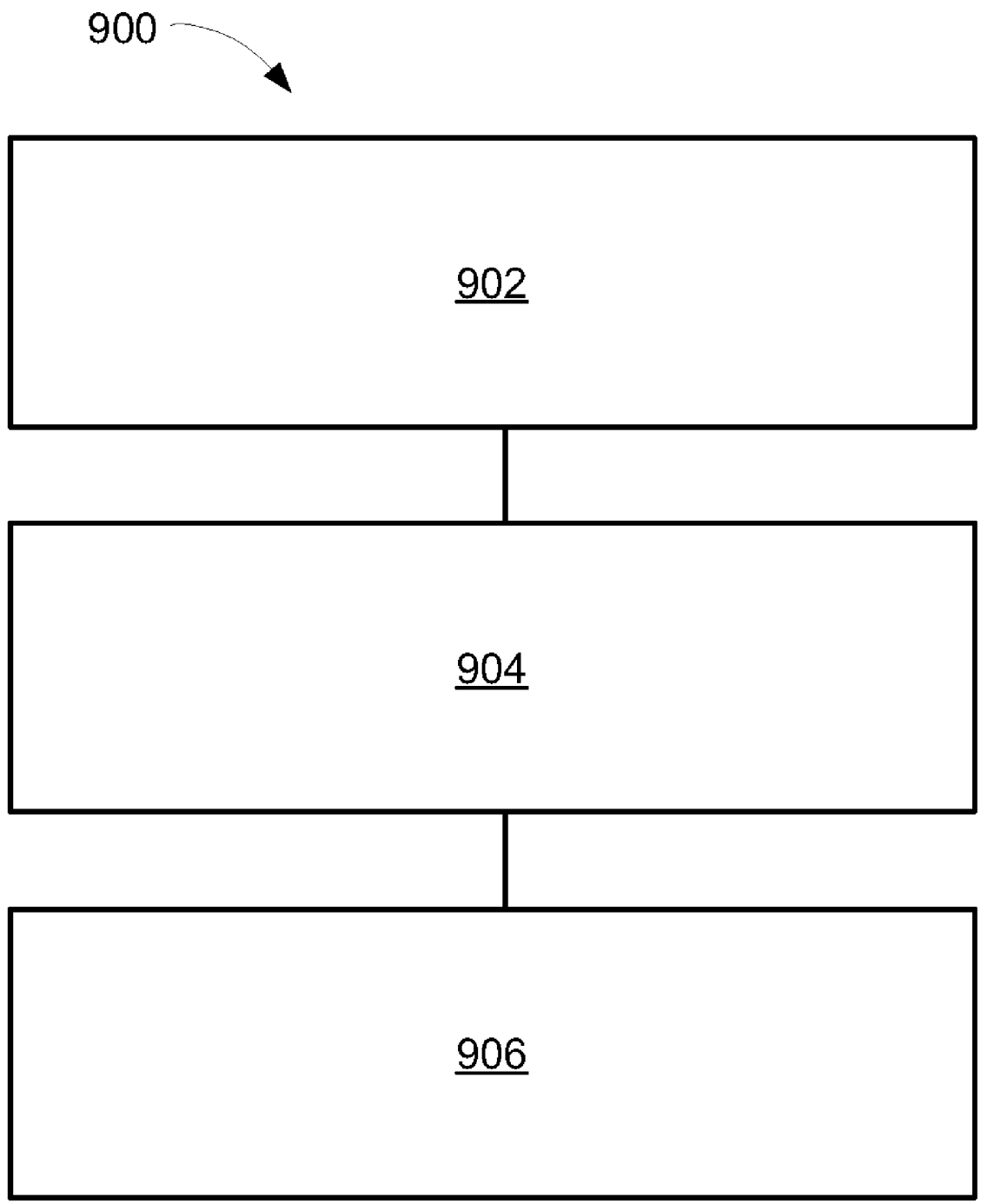
FIG. 9 is a flow chart of an integrated circuit leadless package system for the manufacture of the integrated circuit leadless package system, in an embodiment of the present invention.

Referring now to FIG. 9, therein is shown a flow chart of an integrated circuit leadless package system 900 for manufacturing an integrated circuit leadless package system in an embodiment of the present invention. The system 900 includes forming a QFN leadframe comprises providing a die pad, forming a fishtail tie-bar on the die pad, forming a row of an outer contact pad around the die pad, forming an additional outer contact pad around the fishtail tie-bar, and forming an inner contact pad in a staggered position from the outer contact pad in a block 902; mounting an integrated circuit on the die pad of the QFN leadframe in a block 904; and attaching a bond wire from the integrated circuit to the additional instance of the outer contact pad in a block 906.

In greater detail, a method to manufacture an integrated circuit leadless package system, in an embodiment of the present invention, is performed as follows:

1. Forming a QFN leadframe comprises providing a die pad in the center of the QFN leadframe, forming a fishtail tie-bar on the die pad, including forming one of the fishtail tie-bar on each corner of the die pad, forming an outer contact pad around the die pad, forming an additional outer contact pad around the fishtail tie-bar includes having the outer contact pad on each side of the fishtail tie-bar, and forming an inner contact pad in a staggered position from the outer contact pad. (FIG. 1)
2. Mounting an integrated circuit on the die pad of the QFN leadframe. (FIG. 2)
3. Attaching a bond wire from the integrated circuit to the additional outer contact pad. (FIG. 3) and
4. Injecting a molding compound around the integrated circuit, the bond wire, and the QFN leadframe. (FIG. 4)

It has been discovered that the integrated circuit leadless package system enables the addition of several contact pads in a space that was consumed by the old style tie-bar. This additional capability enables the continued use of the dual row QFN package that is important to mobile and consumer electronics industries.

It has been discovered that the present invention thus has numerous aspects.

An aspect is that the present invention by facilitating additional contact pads in the dual row QFN package, the useful life of the package style is extended. This preserves a significant industry investment in assembly machines and test equipment.

Another aspect is the addition of several contact pads to the dual row QFN package, more integrated functions can take benefit from the small size and ease of assembly.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit leadless package system method and apparatus of the present invention furnish important and heretofore unknown and unavailable solutions, capabilities, and functional aspects for inexpensively increasing the contact pad count of the dual row QFN package. The resulting processes and configurations are straightforward, cost-effective, uncomplicated, highly versatile and effective, can be implemented by adapting known technologies, and are thus readily suited for efficiently and economically manufacturing dual row QFN devices fully compatible with conventional manufacturing processes and technologies. The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit leadless package system comprising:
   forming a leadframe comprises:
      providing a die pad,
      forming a tie-bar, having at least a portion of a fishtail shape, connected to the die pad,
      forming an outer contact pad shorter than and next to the portion of the fishtail shape without another intervening contact pad between the outer contact pad and the tie-bar, and
      forming an inner contact pad longer than and next to the outer contact pad;
   mounting an integrated circuit on the die pad of the leadframe; and
   attaching bond wires from the integrated circuit to the inner and outer contact pads.

2. The system as claimed in claim 1 wherein forming the tie-bar includes;
   forming a vertical tie-bar or a horizontal tie-bar connected to the die pad; and
   providing an additional outer contact pad next to the portion of the fishtail shape on the opposite side of the tie-bar from the outer contact pad.

3. The system as claimed in claim 1 wherein forming the tie-bar includes;
   forming a fishtail shape; and
   providing an additional outer contact pad next to the fishtail shape on the opposite side of the tie-bar from the outer contact pad.

4. The system as claimed in claim 1 wherein forming the tie-bar includes;
   forming a clockwise tie-bar or a counter clockwise tie-bar connected to the die pad; and
   providing an additional outer contact pad next to the portion of the fishtail shape on the opposite side of the tie-bar from the outer contact pad.

5. The system as claimed in claim 1 wherein forming the tie-bar includes;
   forming a fishtail shape;
   providing two outer contact pads within the fishtail shape; and
   providing an additional outer contact pad next to the fishtail shape on the opposite side of the tie-bar from the outer contact pad.

6. An integrated circuit leadless package system comprising:
   forming a QFN leadframe comprises:
      providing a die pad in the center of the QFN leadframe,
      forming bars, having at least portions of fishtail shapes, connected to each corner of the die pad,
      forming outer contact pads shorter than and next to the portions of fishtail shapes without other intervening contact pads between the outer contact pad and the tie-bar, and
      forming inner contact pads longer than and next to and in a staggered position from the outer contact pads;
   mounting an integrated circuit on the die pad of the QFN leadframe;
   attaching bond wires from the integrated circuit to the inner and outer contact pads; and
   injecting a molding compound around the integrated circuit, the bond wire, and the QFN leadframe.

7. The system as claimed in claim 6 wherein forming the tie-bars includes;
   forming vertical tie-bars or horizontal tie-bars conntected to the die pad, wherein the vertical tie-bars or the horizontal tie-bars are stamped, half etched, forged, or a combination thereof.

8. The system as claimed in claim 6 wherein forming the tie-bars includes;
   forming fishtail shapes; and
   providing additional outer contact pads next to the fishtail shapes on the opposite sides of the tie-bars from the outer contact pads.

9. The system as claimed in claim 6 wherein forming the tie-bars includes;
   forming a clockwise tie-bars or a counter clockwise tie-bar connected to the die pad, wherein the clockwise tie-bars or the counter clockwise tie-bars are stamped, half etched, forged, or a combination thereof.

10. The system as claimed in claim 6 wherein forming the tie-bars includes;
    forming fishtail shapes;
    providing two outer contact pads within each of the fishtail shapes; and
    providing additional outer contact pads next to the fishtail shapes on the opposite sides of the tie-bars from the outer contact pads.

11. An integrated circuit leadless package system comprising:
    a leadframe comprises:
       a die pad,
       a tie-bar, having at least a portion of a fishtail shape, connected to the die pad,
       an outer contact pad shorter than and next to the portion of the fishtail shape without another intervening contact pad between the outer contact pad and the tie-bar, and
       an inner contact pad longer than and next to the outer contact pad;
    an integrated circuit mounted on the die pad of the leadframe; and
    bond wires attached from the integrated circuit to the inner and outer contact pads.

12. The system as claimed in claim 11 wherein the tie-bar includes;
    a vertical tie-bar or a horizontal tie-bar connected to the die pad; and
    an additional outer contact pad provided next to the portion of the fishtail shape on the opposite side of the tie-bar from the outer contact pad.

13. The system as claimed in claim 11 wherein the tie-bar includes;
    a fishtail shape; and
    an additional outer contact pad provided next to the fishtail shape on the opposite side of the tie-bar from the outer contact pad.

14. The system as claimed in claim 11 wherein the tie-bar includes;
    a clockwise tie-bar or a counter clockwise tie-bar connected to the die pad; and
    an additional outer contact pad provided next to the portion of the fishtail shape on the opposite side of the tie-bar from the outer contact pad.

15. The system as claimed in claim 11 wherein the tie-bar includes;
    a fishtail shape;
    two outer contact pads provided within the fishtail shape; and an additional outer contact pad provided next to the fishtail shape on the opposite side of the tie-bar from the outer contact pad.

16. The system as claimed in claim 11, wherein:
the leadframe is a QFN leadframe wherein:
the die pad is centered in the QFN leadframe,
the tie-bar is one of a plurality of tie-bars, having at least portions of fishtail shapes, connected to each corner of the die pad, and
the inner contact pad is one of a plurality of inner contact pads formed around the tie-bars; further comprising:
a molding compound injected around the integrated circuit, the bond wires, and the QFN leadframe.

17. The system as claimed in claim 16 wherein the tie-bar includes;
clockwise tie-bars or counter clockwise tie-bars connected to the die pad, wherein the clockwise tie-bars or the counter clockwise tie-bar are stamped, half etched, forged, or a combination thereof.

18. The system as claimed in claim 16 wherein the tie-bar includes;
fishtail shapes:
two outer contact pads within each of the fishtail shapes; and
additional outer contact pads next to the fishtail shapes on the opposite sides of the tie-bars from the outer contact pads.

19. The system as claimed in claim 16 wherein the tie-bar includes;
vertical tie-bars or horizontal tie-bars connected to the die pad, wherein the vertical tie-bars or the horizontal tie-bars are stamped, half etched, forged, or a combination thereof.

20. The system as claimed in claim 16 wherein the tie-bar includes;
fishtail shapes; and
additional outer contact pads next to the fishtail shapes on the opposite sides of the tie-bars from the outer contact pads.

* * * * *

UNITED STATES PATENT AND TRADEMARK OFFICE
CERTIFICATE OF CORRECTION

PATENT NO. : 7,498,665 B2
APPLICATION NO. : 11/381726
DATED : March 3, 2009
INVENTOR(S) : Alabin et al.

It is certified that error appears in the above-identified patent and that said Letters Patent is hereby corrected as shown below:

Title page, item (66), Related U.S. Application Data:
Delete "Substitute for Application" and insert therefore -- Provisional Application --

Column 6, line 4, delete "comer" and insert therefor -- corner --

Claim 2, Column 7, line 19, delete ";" after "includes" and insert therefore -- : --

Claim 3, Column 7, line 26, delete ";" after "includes" and insert therefore -- : --

Claim 4, Column 7, line 32, delete ";" after "includes" and insert therefore -- : --

Claim 5, Column 7, line 39, delete ";" after "includes" and insert therefore -- : --

Claim 6, Column 7, line 51, delete "bars" and insert therefor -- tie-bars --

Claim 7, Column 7, line 65, delete ";" after "includes" and insert therefore -- : --

Claim 8, Column 8, line 6, delete ";" after "includes" and insert therefore -- : --

Claim 9, Column 8, line 12, delete ";" after "includes" and insert therefore -- : --

Claim 10, Column 8, line 18, delete ";" after "includes" and insert therefore -- : --

Claim 12, Column 8, line 42, delete ";" after "includes" and insert therefore -- : --

UNITED STATES PATENT AND TRADEMARK OFFICE
CERTIFICATE OF CORRECTION

PATENT NO. : 7,498,665 B2
APPLICATION NO. : 11/381726
DATED : March 3, 2009
INVENTOR(S) : Alabin et al.

It is certified that error appears in the above-identified patent and that said Letters Patent is hereby corrected as shown below:

Claim 13, Column 8, line 49, delete ";" after "includes" and insert therefore -- : --

Claim 14, Column 8, line 55, delete ";" after "includes" and insert therefore -- : --

Claim 15, Column 8, line 62, delete ";" after "includes" and insert therefore -- : --

Claim 17, Column 9, line 15, delete ";" after "includes" and insert therefore -- : --

Claim 17, Column 9, line 18, delete "tie-bar" and insert therefor -- tie-bars --

Claim 18, Column 9, line 21, delete ";" after "includes" and insert therefore -- : --

Claim 19, Column 10, line 8, delete ";" after "includes" and insert therefore -- : --

Claim 20, Column 10, line 14, delete ";" after "includes" and insert therefore -- : --

Signed and Sealed this

Twenty-eighth Day of April, 2009

JOHN DOLL
*Acting Director of the United States Patent and Trademark Office*